United States Patent
Ohyama et al.

(10) Patent No.: US 10,356,921 B2
(45) Date of Patent: Jul. 16, 2019

(54) ELECTRONIC COMPONENT UNIT, WIRE HARNESS, AND VENTILATOR WATERPROOFING STRUCTURE

(71) Applicants: Yazaki Corporation, Tokyo (JP); Mitsubishi Electric Corporation, Tokyo (JP)

(72) Inventors: Kouichi Ohyama, Shizuoka (JP); Mitsunori Nishida, Tokyo (JP); Osamu Nishizawa, Tokyo (JP)

(73) Assignees: YAZAKI CORPORATION, Minato-ku, Tokyo (JP); Mitsubishi Electric Corporation, Chiyoda-ku, Tokyo (JP)

(*) Notice: Subject to any disclaimer, the term of this patent is extended or adjusted under 35 U.S.C. 154(b) by 11 days.

(21) Appl. No.: 15/883,300

(22) Filed: Jan. 30, 2018

(65) Prior Publication Data
US 2018/0376604 A1 Dec. 27, 2018

(30) Foreign Application Priority Data
Jun. 21, 2017 (JP) ................................. 2017-121581

(51) Int. Cl.
*H05K 5/00* (2006.01)
*H05K 5/02* (2006.01)
*B60R 16/02* (2006.01)
*B60R 16/023* (2006.01)

(52) U.S. Cl.
CPC ....... *H05K 5/0213* (2013.01); *B60R 16/0215* (2013.01); *H05K 5/0052* (2013.01); *B60R 16/0239* (2013.01)

(58) Field of Classification Search
CPC ........................ B60R 16/0239; B60R 16/0215
See application file for complete search history.

(56) References Cited

U.S. PATENT DOCUMENTS

| 4,828,507 A * | 5/1989 | Nagase | H01R 13/5205 439/198 |
| 2011/0211311 A1* | 9/2011 | Shinoda | H05K 5/0047 361/694 |
| 2014/0065877 A1* | 3/2014 | Ohhashi | H05K 5/0052 439/519 |
| 2014/0080329 A1* | 3/2014 | Yamanaka | H05K 5/0069 439/76.1 |
| 2018/0376604 A1* | 12/2018 | Ohyama | H05K 5/0213 |

FOREIGN PATENT DOCUMENTS

JP    2013-069736 A    4/2013

* cited by examiner

*Primary Examiner* — Abdullah A Riyami
*Assistant Examiner* — Nader J Alhawamdeh
(74) *Attorney, Agent, or Firm* — Sughrue Mion, PLLC

(57) ABSTRACT

A ventilator waterproofing structure applicable to an electronic component unit of a wire harness includes a projected columnar portion that is formed in a columnar shape and that is projected from a wall body of a casing in a first direction, a notch that is formed on the projected columnar portion in a straight line in a second direction, a step portion provided in the notch on a closed end side, and a closed space surrounded by an inner wall surface of the notch and a step surface of the step portion. A ventilation passage provided with a waterproof ventilation filter has an outside opening that is opened toward a closed space in a third direction in the notch.

6 Claims, 12 Drawing Sheets

ELECTRONIC COMPONENT UNIT, WIRE HARNESS, AND VENTILATOR WATERPROOFING STRUCTURE

CROSS-REFERENCE TO RELATED APPLICATION(S)

The present application claims priority to and incorporates by reference the entire contents of Japanese Patent Application No. 2017-121581 filed in Japan on Jun. 21, 2017.

BACKGROUND OF THE INVENTION

1. Field of the Invention

The present invention relates to an electronic component unit, a wire harness, and a ventilator waterproofing structure.

2. Description of the Related Art

For example, as a conventional electronic component unit applied to a wire harness and the like in a vehicle, Japanese Patent Application Laid-open No. 2013-069736 discloses an electronic control device in which a circuit board mounted with electronic components is accommodated in a waterproof space inside a casing obtained by joining a plurality of members. The electronic control device is provided with an air hole and a protective wall. The air hole penetrates through an outer wall of the casing in the thickness direction. The protective wall covers an outside opening of the air hole that is opened in an outer surface of an outer wall at a predetermined interval. In the electronic control device, a waterproof ventilation film having breathability and waterproof property is fitted to an inside opening of the air hole that is opened in an inner surface of the outer wall. The air hole is provided in an inclined wall that is inclined relative to a fitting surface among the outer walls of the casing so that the waterproof ventilation film is inclined relative to the fitting surface of the casing to the vehicle side at a predetermined angle.

The electronic control device disclosed in Japanese Patent Application Laid-open No. 2013-069736 described above is required to have further improvement in preventing liquid from infiltrating into an inner side of the casing, for example.

SUMMARY OF THE INVENTION

The present invention has been made in view of the above circumstances, and the object of the present invention is to provide an electronic component unit, a wire harness, and a ventilator waterproofing structure capable of properly preventing liquid from infiltrating into the casing side.

In order to achieve the above mentioned object, an electronic component unit according to one aspect of the present invention includes a casing that includes a wall body forming a waterproof space that accommodates an electronic component and a ventilation passage penetrating through the wall body in a first direction and communicating an inside and an outside of the waterproof space, and a waterproof ventilation filter that is provided by covering an inside opening as an opening of the ventilation passage on the waterproof space side, and that prevents liquid from passing therethrough but allows gas to pass therethrough, wherein the casing includes a ventilator waterproofing structure including a projected columnar portion that is formed in a columnar shape and that is projected toward the outside of the waterproof space from the wall body in the first direction, a notch that is formed on the projected columnar portion in a straight line in a second direction intersecting with the first direction, that forms an opened end that is an end on one side in the second direction opened on a side surface of the projected columnar portion in the second direction, and that forms a closed end that is a closed end on another side in the second direction, a step portion that is formed to have a step provided in the notch on the closed end side and that is projected toward the outside of the waterproof space from a bottom surface of the notch in the first direction relative to the bottom surface in the first direction, and a closed space surrounded by an inner wall surface of the notch and a step surface of the step portion relative to the bottom surface, and the ventilation passage includes an outside opening that extends to an inside of the projected columnar portion in the first direction and that is opened toward the closed space in a third direction intersecting with the first direction and the second direction in the notch.

According to another aspect of the present invention, in the electronic component unit, the outside opening may be disposed on the step of the step portion at an interval in the second direction.

According to still another aspect of the present invention, in the electronic component, the casing may include a connector fitting portion that is integrally formed with the wall body and into which a counterpart connector electrically connected with the electronic component is capable of being fitted.

A wire harness according to still another aspect of the present invention includes a conductive wiring member, and an electronic component unit electrically connected to the wiring member, wherein the electronic component unit includes a casing that includes a wall body forming a waterproof space that accommodates an electronic component to be electrically connected to the wiring member and a ventilation passage penetrating through the wall body in a first direction and communicating an inside and an outside of the waterproof space, and a waterproof ventilation filter that is provided by covering an inside opening as an opening of the ventilation passage on the waterproof space side, and that prevents liquid from passing therethrough but allows gas to pass therethrough, the casing includes a ventilator waterproofing structure including a projected columnar portion that is formed in a columnar shape and that is projected toward the outside of the waterproof space from the wall body in the first direction, a notch that is formed on the projected columnar portion in a straight line in a second direction intersecting with the first direction, that forms an opened end that is an end on one side in the second direction opened on a side surface of the projected columnar portion in the second direction, and that forms a closed end that is a closed end on another side in the second direction, a step portion that is formed to have a step provided in the notch on the closed end side and that is projected toward the outside of the waterproof space from a bottom surface of the notch in the first direction relative to the bottom surface in the first direction, and a closed space surrounded by an inner wall surface of the notch and a step surface of the step portion relative to the bottom surface, and the ventilation passage includes an outside opening that extends to an inside of the projected columnar portion in the first direction and that is opened toward the closed space in a third direction intersecting with the first direction and the second direction in the notch.

A ventilator waterproofing structure according to still another aspect of the present invention includes a projected columnar portion that is formed in a columnar shape and that is projected toward an outside of a waterproof space from a wall body of a casing forming the waterproof space, in a first direction, a notch that is formed on the projected columnar portion in a straight line in a second direction intersecting with the first direction, that forms an opened end that is an end on one side in the second direction opened on a side surface of the projected columnar portion in the second direction, and that forms a closed end that is a closed end on another side in the second direction, a step portion that is formed to have a step provided in the notch on the closed end side and that is projected toward the outside of the waterproof space from a bottom surface of the notch in the first direction relative to the bottom surface in the first direction, and a closed space surrounded by an inner wall surface of the notch and a step surface of the step portion relative to the bottom surface, wherein a ventilation passage, that penetrates through the wall body in the first direction and communicates an inside and the outside of the waterproof space, and that is provided with a waterproof ventilation filter that covers an inside opening as an opening on the waterproof space side and preventing liquid from passing therethrough but allowing gas to pass therethrough, includes an outside opening that extends to an inside of the projected columnar portion in the first direction and that is opened toward the closed space in a third direction intersecting with the first direction and the second direction in the notch.

The above and other objects, features, advantages and technical and industrial significance of this invention will be better understood by reading the following detailed description of presently preferred embodiment of the invention, when considered in connection with the accompanying drawings.

DETAILED DESCRIPTION OF THE PREFERRED EMBODIMENTS

Hereinafter, an embodiment according to the present invention will be described in detail with reference to the accompanying drawings. It is to be noted that the present invention is not limited to the embodiment. Moreover, components in the following embodiment include components that can be easily replaced by a person skilled in the art or components that are substantially the same.

Figure 1:
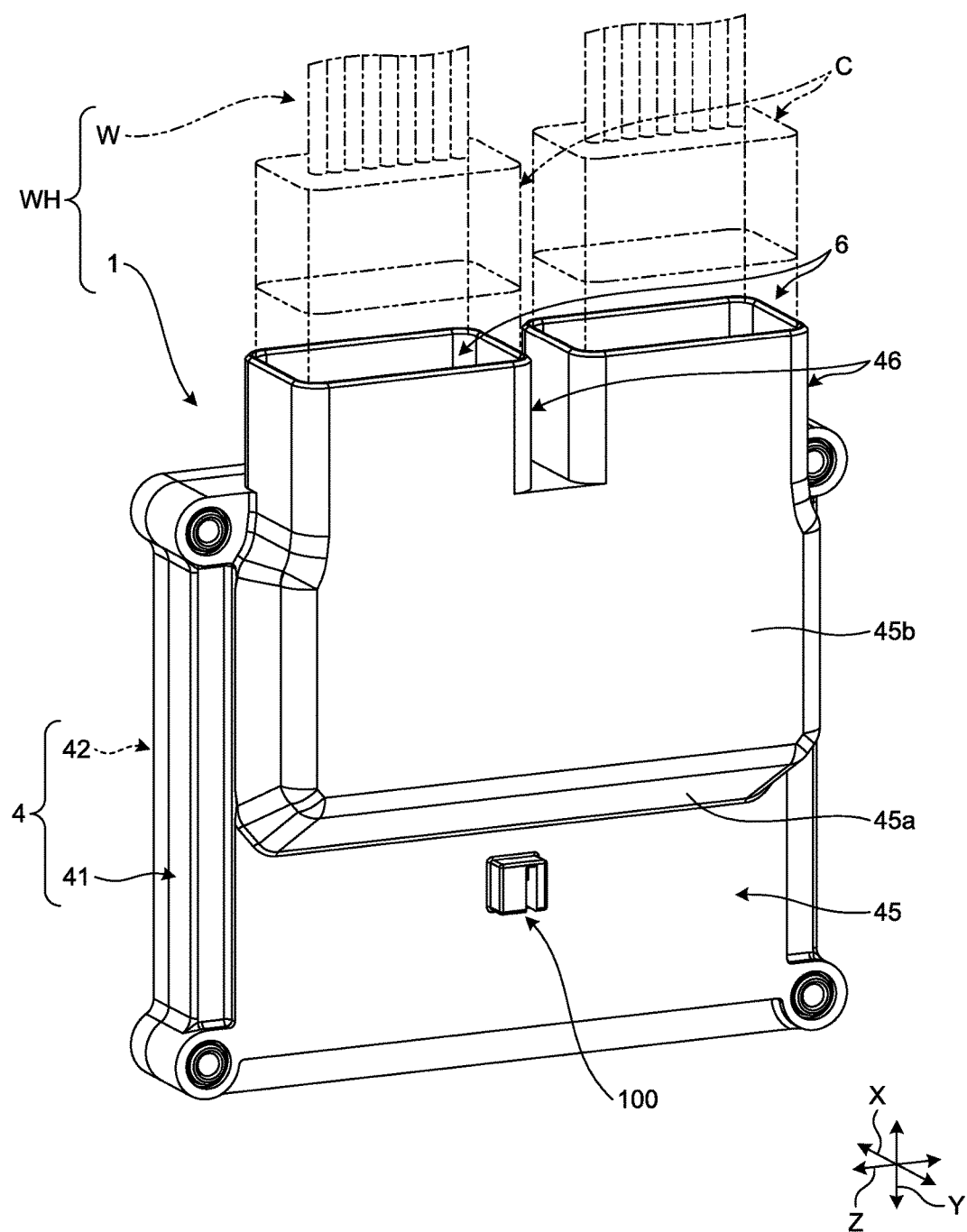
FIG. 1 is a perspective view illustrating a schematic configuration of an electronic component unit according to an embodiment.
Figure 2:
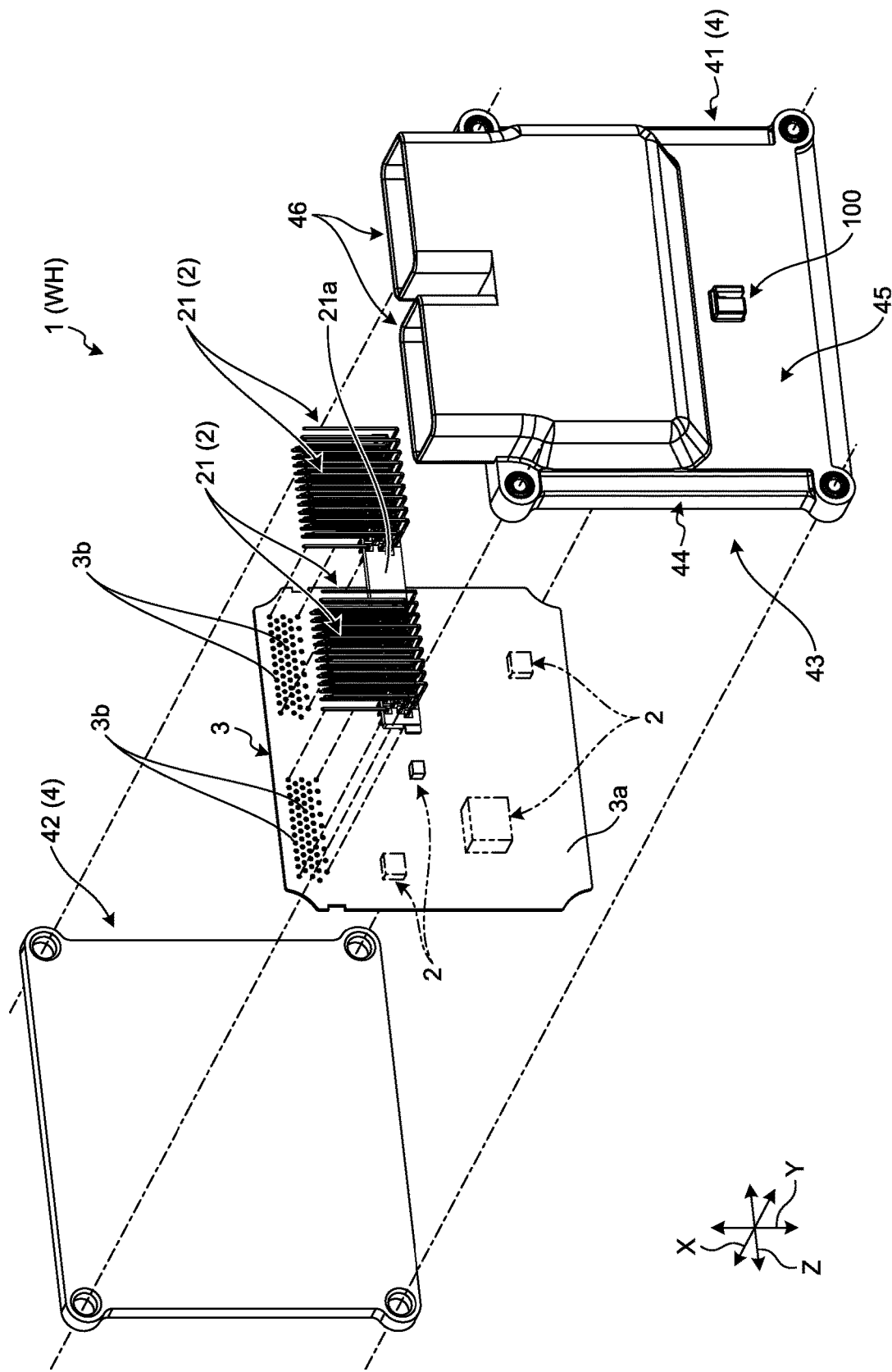
FIG. 2 is an exploded perspective view illustrating a schematic configuration of the electronic component unit according to the embodiment.

In FIG. 1, counterpart connectors and wiring members are simply illustrated by two-dot chain lines, and in the other drawings, illustrations of the counterpart connectors and the wiring members are omitted. In FIG. 2, a part of electronic components to be mounted on a substrate is simply illustrated by the two-dot chain lines, and in the other drawings, illustrations of the electronic components are omitted. In the following explanation, in a first direction, a second direction, and a third direction that are intersecting with each other, the first direction is referred to as a "laminating direction X", the second direction is referred to as a "first width direction Y", and the third direction is referred to as a "second width direction Z". In this example, the laminating direction X, the first width direction Y, and the second width direction Z are orthogonal to each other. Typically, the laminating direction X corresponds to an extending direction of a ventilation passage and a projecting direction of a projected columnar portion, which will be described below. Typically, the first width direction Y corresponds to an extending direction of a notch, which will be described below. Typically, the second width direction Z corresponds to an opening direction of an outside opening of the ventilation passage, which will be described below. Unless otherwise specified, the directions used in the following description are directions that are set while components are assembled with each other and electronic component units are mounted on a vehicle.

For example, an electronic component unit 1 illustrated in FIG. 1 is mounted on a vehicle such as an automobile, and is incorporated into a wire harness WH. For example, the wire harness WH connects between devices mounted on the vehicle, by bundling a plurality of wiring members W used for supplying power and communicating signals into a collective component, and by connecting the wiring members W with the devices using a connector and the like. The wire harness WH includes the wiring members W, which are conductive, and the electronic component unit 1 that is electrically connected to the wiring members W. For example, the wiring members W are formed of metal rods, wires, wire bundles, and the like. The metal rods are obtained by coating the outside of a conductive rod-shaped member with an insulating coating part. The wires are obtained by coating the outside of a conductor (core wire) made of a plurality of conductive metal strands with an insulating coating part. The wire bundles are obtained by bundling the wires. In the wire harness WH, the wiring members W are collectively bundled, and the electronic component unit 1 is electrically connected via a counterpart connector C or the like that is provided on the terminal of the bundled wiring members W. The wire harness WH may also include a grommet, a protector, a fixing tool, and the like. For example, the electronic component unit 1 is installed in an engine room and the like in a vehicle and implements various functions. In the electronic component unit 1 of the present embodiment, a ventilation passage 47, a waterproof ventilation filter 5, and a ventilator waterproofing structure 100 are provided in a casing 4 that accommodates electronic components 2. Consequently, the electronic component unit 1 of the present embodiment is capable of adjusting the internal pressure of the casing 4 and preventing liquid from infiltrating into the casing 4. Hereinafter, a configuration of the electronic component unit 1 will be described in detail with reference to the accompanying drawings.

Figure 3:
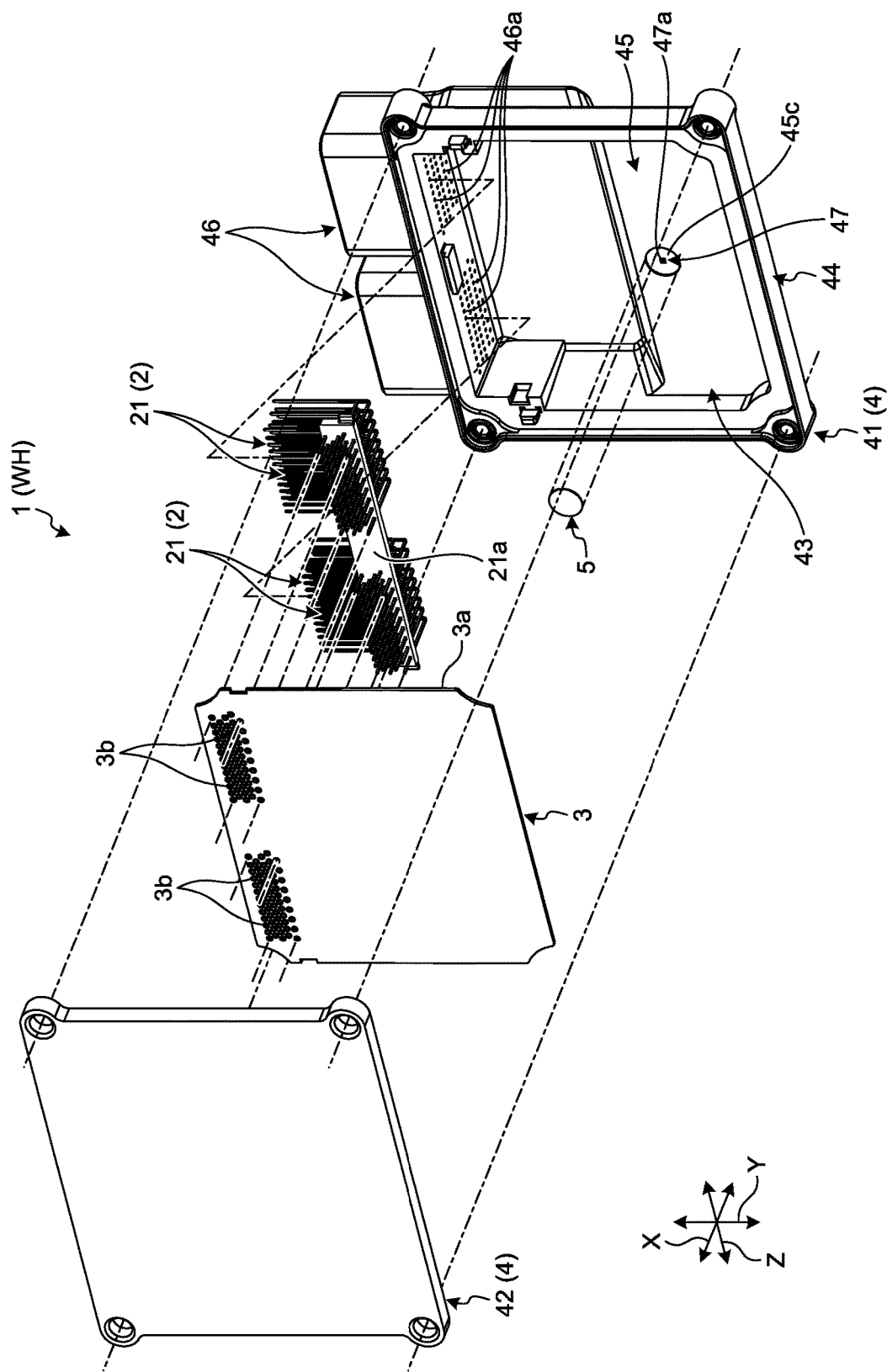
FIG. 3 is an exploded perspective view illustrating a schematic configuration of the electronic component unit according to the embodiment.

As illustrated in FIG. 1, FIG. 2, and FIG. 3, the electronic component unit 1 of the present embodiment includes the electronic component 2, a substrate 3, the casing 4, and the waterproof ventilation filter 5.

The electronic component 2 is an element accommodated in the casing 4 and exerts various functions. The electronic component 2 is electrically connected to the wiring members W. A plurality of electronic components 2 is provided in the present embodiment. For example, the electronic components 2 include a capacitor, a relay, a resistance, a transistor, a fuse, a connector, an intelligent power switch (IPS), an electronic control unit including a microcomputer, and the like. In this example, the electronic components 2 include a plurality of bent terminals 21 and the like, for example. The bent terminals 21 form a printed circuit board (PCB) connector 6 (see FIG. 1) integrated with the casing, with an aligning plate 21a, a part of the casing 4 (a connector fitting portion 46, which will be described below), and the like. The PCB connector 6 configures a wire-to-board connection mechanism and the like for electrically connecting the substrate 3 with the counterpart connector C provided on the terminal of the wiring members W. Each of the bent terminals 21 electrically connects the substrate 3 with the counterpart connector C. The bent terminals 21 are configured of a metal material that is entirely conductive and the like, and conductive plating and the like is applied on the surface. Each of the bent terminals 21 is a rectangular wire formed in a rod shape and is bent in a substantially L-shape. One of the ends of the bent terminals 21 is held by one of a plurality of cavities 46a of the casing 4, which will be described below. The aligning plate 21a is mounted on the other ends of the bent terminals 21, and the other ends of the bent terminals 21 are electrically connected to the substrate 3, which will be described below.

The electronic components 2 are provided on the substrate 3, and the substrate 3 is accommodated inside the casing 4 with the electronic components 2. Moreover, the wiring members W are electrically connected to the substrate 3. The electronic components 2 are mounted on a mounting surface 3a of the substrate 3, and the substrate 3 forms an electronic circuit that electrically connects the electronic components 2. In this example, the substrate 3 is what is called a printed circuit board (PCB), for example. In the substrate 3, wiring patterns (print patterns) formed of a conductive material such as copper are printed on an insulating layer made of an insulating material such as epoxy resin, glass epoxy resin, paper epoxy resin, and a ceramic. Consequently, a circuit is configured by the wiring patterns. In this example, the substrate 3 has a substantially rectangular plate shape so that the laminating direction X is the plate thickness direction, and the first width direction Y and the second width direction Z are extending directions of the sides. The electronic components 2 are mounted on the mounting surface 3a of the substrate 3, when lead wires and terminals of the electronic components 2 are electrically connected to the circuit by soldering and the like. For example, the circuit is electrically connected by soldering and the like, when the ends of the bent terminals 21 at the aligning plate 21a side are inserted into a plurality of through holes 3b of the substrate 3 that are penetrated through the substrate 3 in the laminating direction X. The circuit of the substrate 3 electrically connects the electronic components 2 (including the bent terminals 21), and configures a circuit system according to the requested functions. In the substrate 3, the counterpart connector C is fitted to the PCB connector 6 configured by the bent terminals 21. With this configuration, the substrate 3 is electrically connected to the wiring members W via the counterpart connector C, and the other electronic components 2 and the wiring members W are electrically connected via the circuit. It is to be noted that the substrate 3 is not limited to the printed circuit board, and may also be what is called an insert bus bar substrate in which a bus bar made of a conductive metal material is incorporated in the inside made of an insulating resin material. In this case, for example, the substrate 3 is obtained by coating a bus bar as a circuit made of a conductive metal material with an insulating resin material.

The casing 4 includes a casing main body 41 and a lid member 42 facing each other in the laminating direction X. The casing 4 also includes a waterproof space 43 formed therein by the casing main body 41 and the lid member 42. The casing 4 accommodates the electronic components 2 and the substrate 3 in the waterproof space 43. The casing 4 has a two-layer division structure divided into the casing main body 41 and the lid member 42. The casing main body 41 and the lid member 42 are made of insulating synthetic resin. The casing 4 has a hollow box shape as a whole by combining and laminating the casing main body 41 and the lid member 42 in the laminating direction X. The waterproof space 43 is formed inside the hollow space in the casing 4.

More specifically, the casing main body 41 forms the casing 4 with the lid member 42, and is integrally formed with units, which will be described below. The casing main body 41 is a dish shaped (tray shaped) member. The casing main body 41 includes a frame-shaped portion 44, a plate-shaped portion 45, and the connector fitting portion 46. The casing main body 41 has a hollow box shape by integrally forming the frame-shaped portion 44, the plate-shaped portion 45, and the connector fitting portion 46. The frame-shaped portion 44 is a frame-shaped wall body that forms the waterproof space 43. The frame-shaped portion 44 has a polygonal tube shape, and in this example, has a substantially rectangular tube shape. The plate-shaped portion 45 is a plate-shaped wall body that forms the waterproof space 43. The plate-shaped portion 45 closes one of the openings of the frame-shaped portion 44 (an opening opposite to the lid member 42 side in the laminating direction X). The plate-shaped portion 45 has a polygonal plate shape, and in this example, similar to that in the substrate 3, the plate-shaped portion 45 has a substantially rectangular plate shape so that the laminating direction X is the plate thickness direction, and the first width direction Y and the second width direction Z are extending directions of the sides. Moreover, a bulging portion 45b is formed on the plate-shaped portion 45 so that a part of the plate-shaped portion 45 is bulging and projecting toward the side opposite from the lid member 42 side in the laminating direction X, having a step portion 45a as a boundary. In the casing main body 41, the space surrounded by the frame-shaped portion 44 and the plate-shaped portion 45 forms the waterproof space 43. The connector fitting portion 46 is integrally formed with the frame-shaped portion 44, the plate-shaped portion 45, and the like at the bulging portion 45b side of the plate-shaped portion 45. As described above, the connector fitting portion 46 is a portion into which the counterpart connector C can be fitted, and forms a part of the PCB connector 6. The connector fitting portion 46 is formed in a tubular shape corresponding to the exterior shape of the counterpart connector C. In this example, the connector fitting portion 46 is formed in a substantially rectangular tube shape into which the counterpart connector C can be fitted. A positional relation of the connector fitting portion 46 is such that the connector fitting portion 46 is projecting and extending toward one of the sides in the first width direction Y from a part of the frame-shaped portion 44 that is placed on the bulging portion 45b side of the plate-shaped portion 45, and is opening toward one of the sides in the first width direction Y. In the connector fitting portion 46, the cavities (retaining through holes) 46a (see FIG. 3) are formed on a part of the frame-shaped portion 44 that is placed inside a portion having a substantially rectangular tube shape. The cavities 46a penetrate through the frame-shaped portion 44 in the first width direction Y. The connector fitting portion 46 holds the bent terminals 21 when one of the ends of each of the bent terminals 21 is pressed into each of the cavities 46a. The casing 4 may also hold the bent terminals 21 when one of the ends of the bent terminals 21 are inserted and molded into the connector fitting portion 46. The connector fitting portion 46 exposes one of the ends of the bent terminals 21 to the inside of the portion having a substantially rectangular tube shape, while holding the bent terminals 21.

In this example, two connector fitting portions 46 are provided at an interval in the second width direction Z. When the counterpart connector C is fitted into each of the connector fitting portions 46, the bent terminals 21 and the counterpart connector C are electrically connected, thereby electrically connecting the substrate 3 with the wiring members W.

The lid member 42 configures the casing 4 with the casing main body 41, and closes the opening of the casing main body 41 at the side opposite from the plate-shaped portion 45 side in the laminating direction X. The lid member 42 is a member having a substantially rectangular plate shape (lid shape). The lid member 42 has about the same shape as the exterior shape of the frame-shaped portion 44 of the casing main body 41. In this example, similar to that in the substrate 3, the lid member 42 is formed in a substantially rectangular plate shape so that the laminating direction X is the plate thickness direction, and the first width direction Y and the second width direction Z are extending directions of the sides. The lid member 42 is a plate-shaped wall body that forms the waterproof space 43. The corner portions of the lid member 42 are fastened and fixed to the frame-shaped portion 44 via a fastening member such as a bolt, while the lid member 42 is laminated on the frame-shaped portion 44 of the casing main body 41 at the side opposite from the plate-shaped portion 45 in the laminating direction X.

The above-configured casing 4 is formed in a substantially rectangular parallelepiped shape as a whole, by assembling the casing main body 41 and the lid member 42 with each other. In the casing 4, the plate-shaped portion 45 of the casing main body 41 and the lid member 42 are facing each other in the laminating direction X, while the casing main body 41 and the lid member 42 are assembled with each other. In the casing 4, a hollow internal space that is partitioned by the frame-shaped portion 44 and the plate-shaped portion 45 of the casing main body 41, and the lid member 42, is formed as the waterproof space 43. For example, in the casing 4 of the present embodiment, the waterproof space 43 configures a waterproof space by interposing a seal member such as a packing between the casing main body 41 and the lid member 42.

The waterproof space 43 is space that accommodates the substrate 3 and the electronic components 2 mounted on the substrate 3. The first width direction Y and the second width direction Z of the waterproof space 43 are surrounded by the frame-shaped portion 44 of the casing main body 41, and both sides of the waterproof space 43 in the laminating direction X are surrounded by the plate-shaped portion 45 of the casing main body 41 and the lid member 42. In other words, the frame-shaped portion 44 of the casing main body 41 partitions the first width direction Y and the second width direction Z of the waterproof space 43, and the plate-shaped portion 45 of the casing main body 41 and the lid member 42 partition the laminating direction X of the waterproof space 43. More specifically, the frame-shaped portion 44 and the plate-shaped portion 45 of the casing main body 41 and the lid member 42 function as partition walls for partitioning the inside and outside of the waterproof space 43. The substrate 3 is disposed and accommodated in the waterproof space 43, while the lid member 42 is not assembled to the casing main body 41. In this case, the substrate 3 is disposed in the waterproof space 43 in a positional relation such that the end of each of the bent terminals 21 that is held in the cavity 46a of the connector fitting portion 46 is inserted into each of the through holes 3b at the aligning plate 21a side. Consequently, in the substrate 3, the ends of the bent terminals 21 are electrically connected to the circuit by soldering and the like. The waterproof space 43 is then partitioned as a waterproof space, by assembling and fixing the lid member 42 to the casing main body 41 while interposing the seal member such as a packing.

Figure 4:
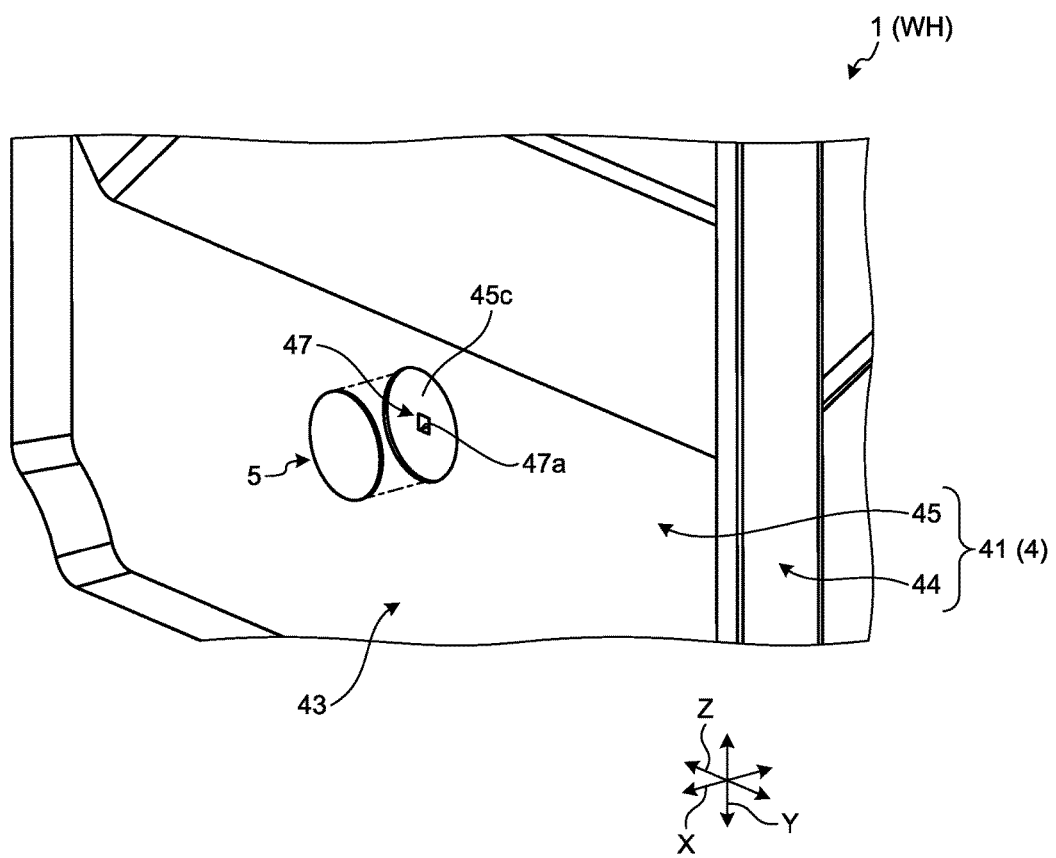
FIG. 4 is a partial exploded perspective view including a ventilation passage and a waterproof ventilation filter of the electronic component unit according to the embodiment.
Figure 5:
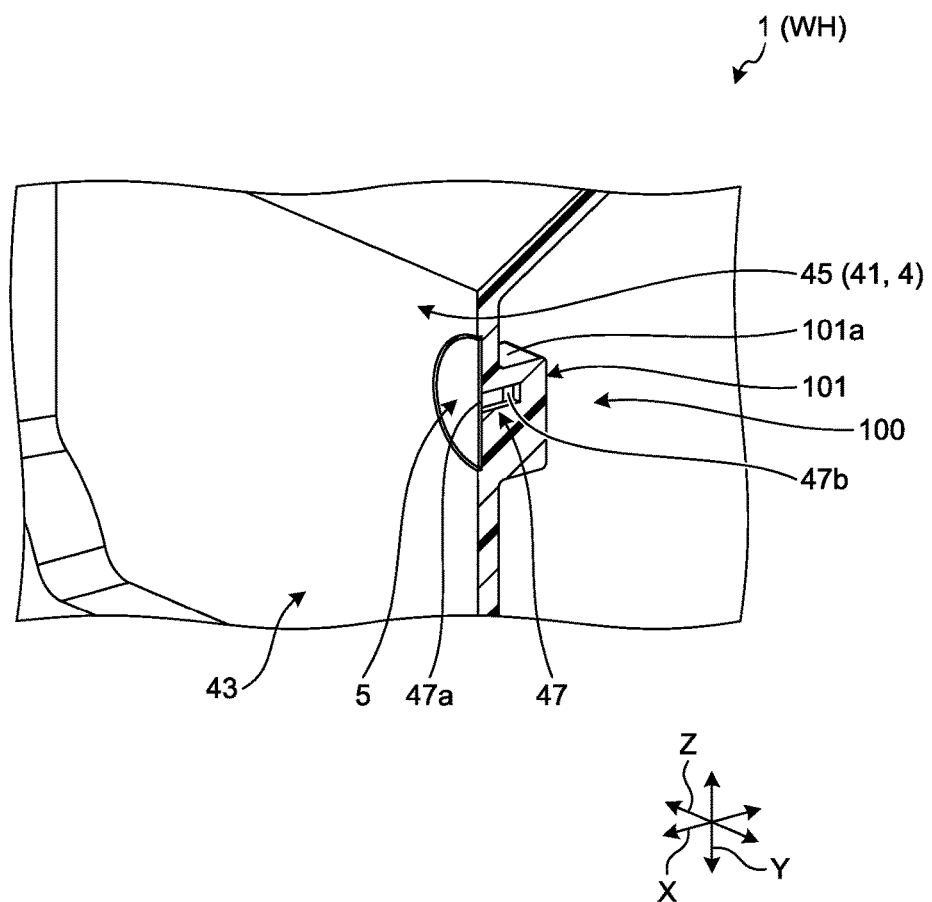
FIG. 5 is a partial sectional perspective view including the ventilation passage, the waterproof ventilation filter, and a ventilator waterproofing structure of the electronic component unit according to the embodiment.

As illustrated in FIG. 3, FIG. 4, and FIG. 5, in the casing 4 of the present embodiment, the casing main body 41 includes the ventilation passage 47, and the waterproof ventilation filter 5 is provided on the portion of the ventilation passage 47. With this configuration, in the casing 4, the internal pressure of the waterproof space 43 can be adjusted via the ventilation passage 47 and the waterproof ventilation filter 5.

The ventilation passage 47 is an air hole that penetrates through the plate-shaped portion 45 of the casing main body 41 of the casing 4 in the laminating direction X, and that communicates the inside and outside of the waterproof space 43. In this example, the sectional shape of the ventilation passage 47 in a direction orthogonal to the laminating direction X is a substantially rectangular shape. Moreover, in this example, the ventilation passage 47 is provided on a substantially center portion of the plate-shaped portion 45 in the second width direction Z, on a planar portion excluding the bulging portion 45b.

Figure 6:
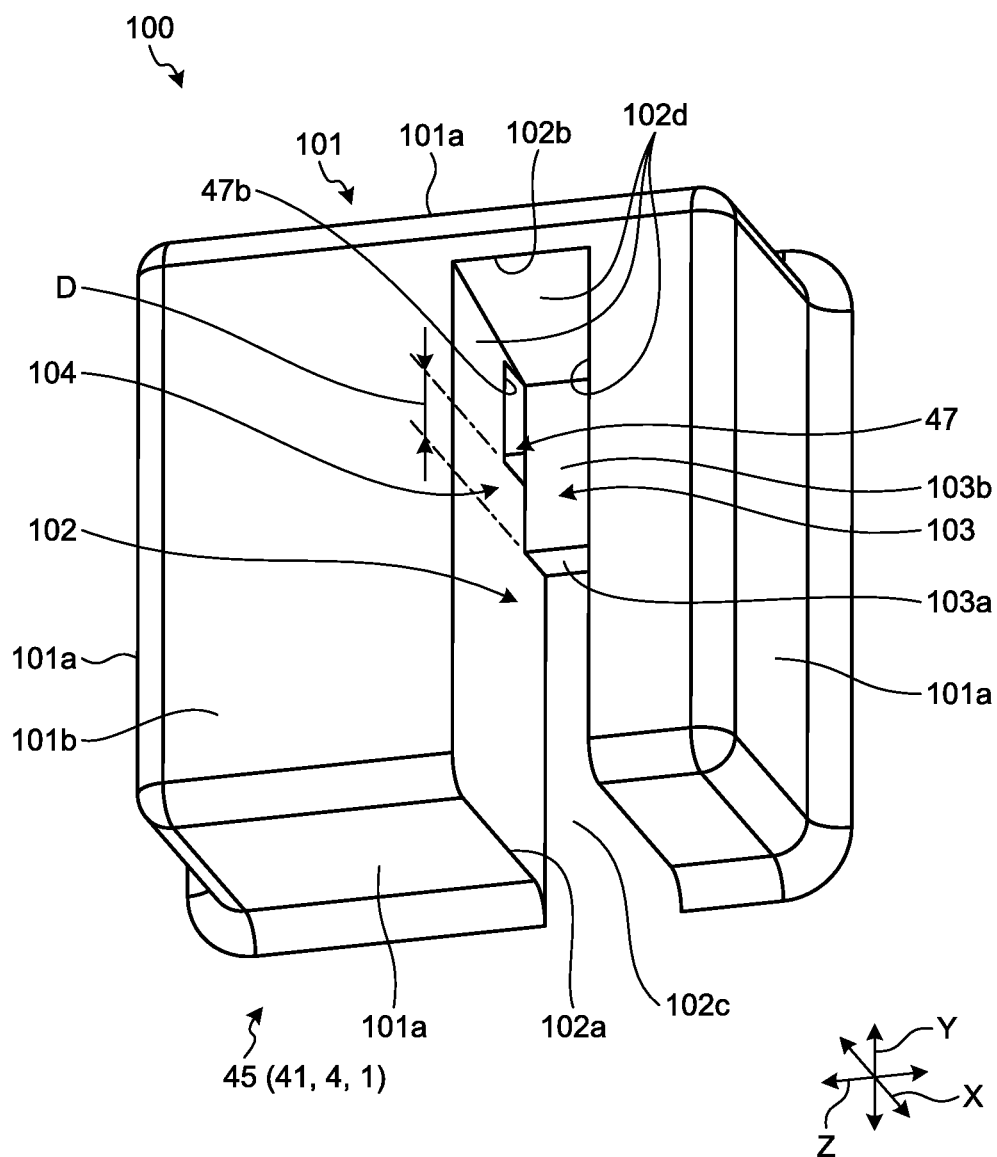
FIG. 6 is a partial perspective view illustrating a schematic configuration of the ventilator waterproofing structure of the electronic component unit according to the embodiment.
Figure 7:
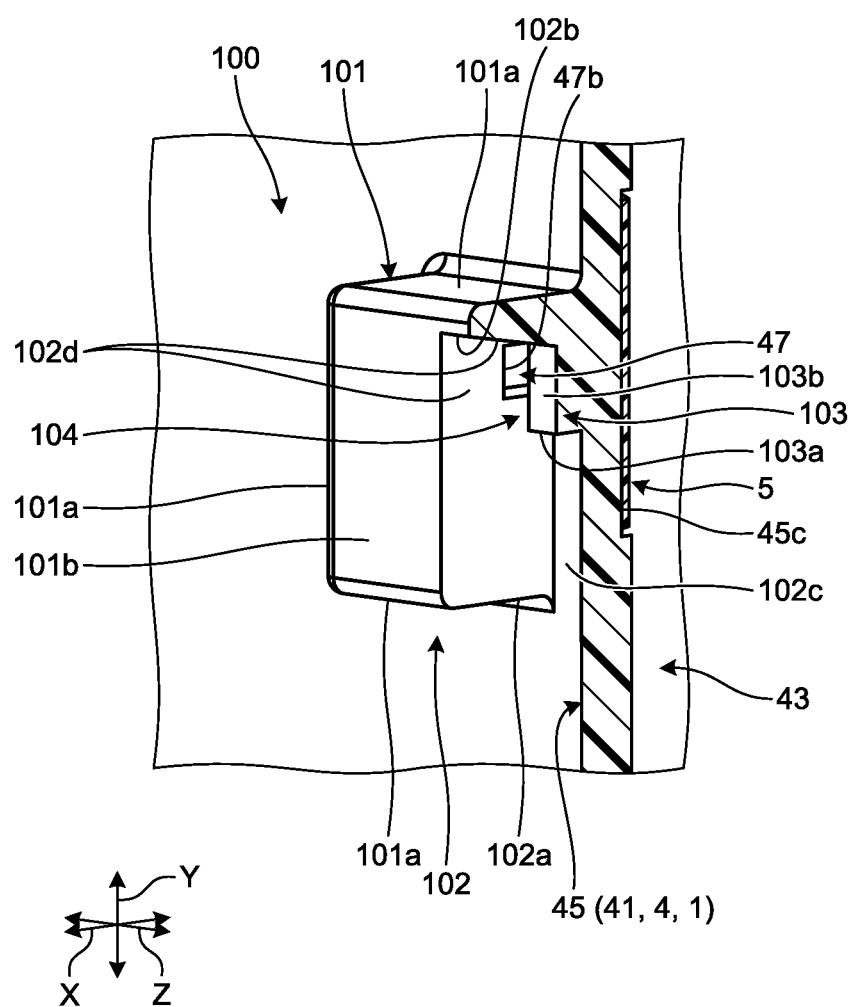
FIG. 7 is a partial sectional perspective view including the ventilation passage, the waterproof ventilation filter, and the ventilator waterproofing structure of the electronic component unit according to the embodiment.
Figure 8:
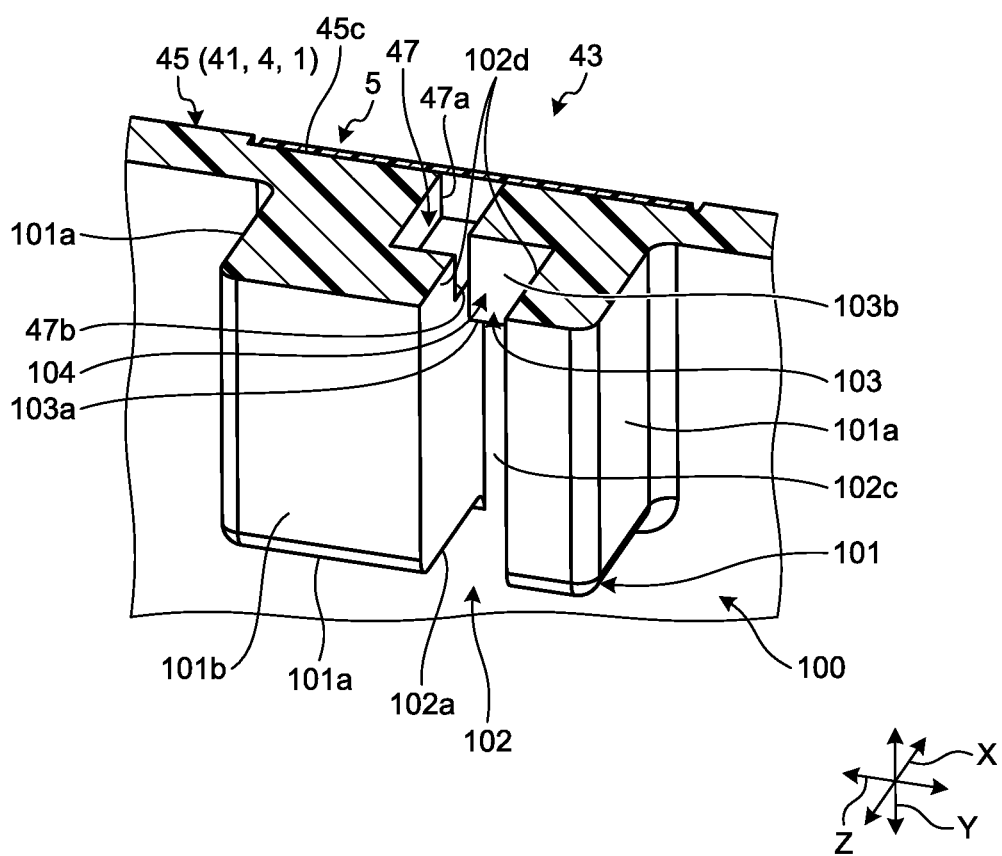
FIG. 8 is a partial sectional perspective view including the ventilation passage, the waterproof ventilation filter, and the ventilator waterproofing structure of the electronic component unit according to the embodiment.

The ventilation passage 47 includes an inside opening 47a and an outside opening 47b. The inside opening 47a of the ventilation passage 47 is formed by opening an end of the ventilation passage 47 on the waterproof space 43 side toward the inside of the waterproof space 43. In other words, the inside opening 47a is opened in the internal surface side (waterproof space 43 side) of the plate-shaped portion 45. On the other hand, the outside opening 47b of the ventilation passage 47 is formed by opening an end opposite from the waterproof space 43 side toward the outside of the waterproof space 43. In other words, the outside opening 47b is opened in the outer surface side (opposite from the waterproof space 43 side) of the plate-shaped portion 45. In this example, the outside opening 47b is opened toward a closed space 104 (see FIG. 6 and the like), which will be described below, in the second width direction Z. In this example, the inside opening 47a and the outside opening 47b are formed as openings each having a substantially rectangular shape.

The waterproof ventilation filter 5 is an internal pressure adjustment filter provided by covering the inside opening 47a that is the opening of the ventilation passage 47 on the waterproof space 43 side, from the waterproof space 43 side. The waterproof ventilation filter 5 prevents liquid such as water from passing through but allows gas such as air to pass through. For example, various types of materials such as a porous film, a microporous film, a microporous structural material may be used for the waterproof ventilation filter 5.

In this example, the waterproof ventilation filter 5 has a substantially circular shape. The waterproof ventilation filter 5 is welded inside an accommodating recessed portion 45c that is formed on the inner surface side (waterproof space 43 side) of the plate-shaped portion 45. The accommodating recessed portion 45c has a substantially circular shape so as to surround the inside opening 47a.

Moreover, as illustrated in FIG. 1 and FIG. 2, the casing main body 41 of the casing 4 in the present embodiment has the ventilator waterproofing structure 100. With this configuration, as described above, the internal pressure of the waterproof space 43 in the casing 4 can be adjusted via the ventilation passage 47 and the waterproof ventilation filter 5. At the same time, the casing 4 ensures the waterproof property of the ventilation passage 47.

More specifically, as illustrated in FIG. 5, FIG. 6, FIG. 7, and FIG. 8, the ventilator waterproofing structure 100 includes a projected columnar portion 101, a notch 102, a step portion 103, and the closed space 104.

The projected columnar portion 101 has a columnar shape, and is projected toward the outside of the waterproof space 43 from the plate-shaped portion 45 of the casing main body 41 of the casing 4 in the laminating direction X. The projected columnar portion 101 is formed on the plate-shaped portion 45 at the position where the ventilation passage 47 is provided. Moreover, the projected columnar portion 101 is provided on the outer surface (the surface opposite from the waterproof space 43 side) of the plate-shaped portion 45, at the position facing the inside opening 47a of the ventilation passage 47 in the laminating direction X. In this example, the projected columnar portion 101 is formed in a substantially rectangular parallelepiped shape having four side surfaces 101a and a single top surface 101b.

The notch 102 is formed on the projected columnar portion 101 in a straight line in the first width direction Y.

One of the ends of the notch 102 in the first width direction Y forms an opening end 102a. The opening end 102a is an end that is opened on one of the side surfaces 101a of the projected columnar portion 101 in the first width direction Y. Moreover, an end of the notch 102 at the other side in the first width direction Y forms a closed end 102b. The closed end 102b is an end closed against the first width direction Y.

In other words, the opening end 102a of the notch 102 is opened in one of the four side surfaces 101a of the projected columnar portion 101, in this example, in one of the side surfaces 101a in the first width direction Y. The opening is not formed in the remaining three side surfaces 101a of the projected columnar portion 101, thereby forming the closed surfaces. As a whole, the notch 102 is formed as a space having a substantially rectangular parallelepiped shape in the first width direction Y. Moreover, the notch 102 is formed as the space surrounded by a bottom surface 102c and three inner wall surfaces 102d. One of the sides of the notch 102 in the laminating direction X (the side opposite from the bottom surface 102c) is opened toward one of the sides in the laminating direction X, and one of the sides of the notch 102 in the first width direction Y is opened toward one of the sides in the first width direction Y. Consequently, the opening end 102a is formed. In this example, the bottom surface 102c is the outer surface of the plate-shaped portion 45. Moreover, in this example, the notch 102 is formed at a position shifted from the center position of the projected columnar portion 101 in the second width direction Z toward one of the side surfaces 101a side in the second width direction Z.

The step portion 103 is provided on the closed end 102b side in the notch 102. The step portion 103 is formed including a step 103a that is provided on the bottom surface 102c of the notch 102 in the laminating direction X and that is projected toward the outside of the waterproof space 43 from the bottom surface 102c in the laminating direction X. In the step portion 103, the surface opposite from the bottom surface 102c side in the laminating direction X is formed as a step surface 103b relative to the bottom surface 102c. In the step portion 103, the step 103a rises substantially vertically from the bottom surface 102c in the laminating direction X, and the step surface 103b is formed so as to be substantially parallel to the bottom surface 102c. The step surface 103b is placed on the closed end 102b side than the step 103a of the step portion 103 in the first width direction Y.

The closed space 104 is the space surrounded by the three inner wall surfaces 102d of the notch 102 and the step surface 103b of the step portion 103 inside the notch 102 on the closed end 102b side. As a whole, the closed space 104 is formed as a space having a substantially rectangular parallelepiped shape in the first width direction Y, in the notch 102 on the closed end 102b side. One of the sides of the closed space 104 (the side opposite from the step surface 103b) in the laminating direction X is opened toward one of the sides in the laminating direction X, and one of the sides of the closed space 104 in the first width direction Y is opened toward one of the sides in the first width direction Y.

The ventilation passage 47 described above extends to the inside of the projected columnar portion 101 in the laminating direction X. In the notch 102, the ventilation passage 47 includes the outside opening 47b that is opened toward the closed space 104 in the second width direction Z. In this example, the outside opening 47b is disposed on the step 103a of the step portion 103 at an interval D (see FIG. 6) in the first width direction Y. The outside opening 47b is formed on one of the sides of the inner wall surface 102d in the second width direction Z, adjacent to one of the sides of the inner wall surface 102d in the first width direction Y.

In the electronic component unit 1 configured as described above, the internal pressure of the waterproof space 43 is adjusted via the ventilation passage 47 and the waterproof ventilation filter 5 provided on the casing main body 41 of the casing 4. For example, in the electronic component unit 1, when a pressure difference is generated between the internal pressure and the external pressure of the waterproof space 43, air flows through the ventilation passage 47 from the outside opening 47b side toward the inside opening 47a side, or from the inside opening 47a side toward the outside opening 47b side, depending on the pressure difference. As a result, in the electronic component unit 1, the pressure of the waterproof space 43 inside the casing 4 is adjusted to be equal to the outside pressure. In this process, in the electronic component unit 1, when the air flows through the ventilation passage 47 from the outside opening 47b side toward the inside opening 47a side, the waterproof ventilation filter 5 allows air to flow therethrough but prevents liquid such as water from flowing therethrough. As a result, in the electronic component unit 1, the pressure inside the waterproof space 43 is adjusted while preventing liquid such as water from infiltrating into the waterproof space 43 side. Consequently, the pressure difference between the inside and outside of the casing 4 is eliminated, and it is possible to maintain the pressure inside the waterproof space 43 at a proper level.

Moreover, in the electronic component unit 1, the ventilator waterproofing structure 100 provided in the casing main body 41 of the casing 4 reliably prevents liquid such as water from infiltrating into the waterproof space 43 side via the outside opening 47b, at various installation positions.

Figure 9:
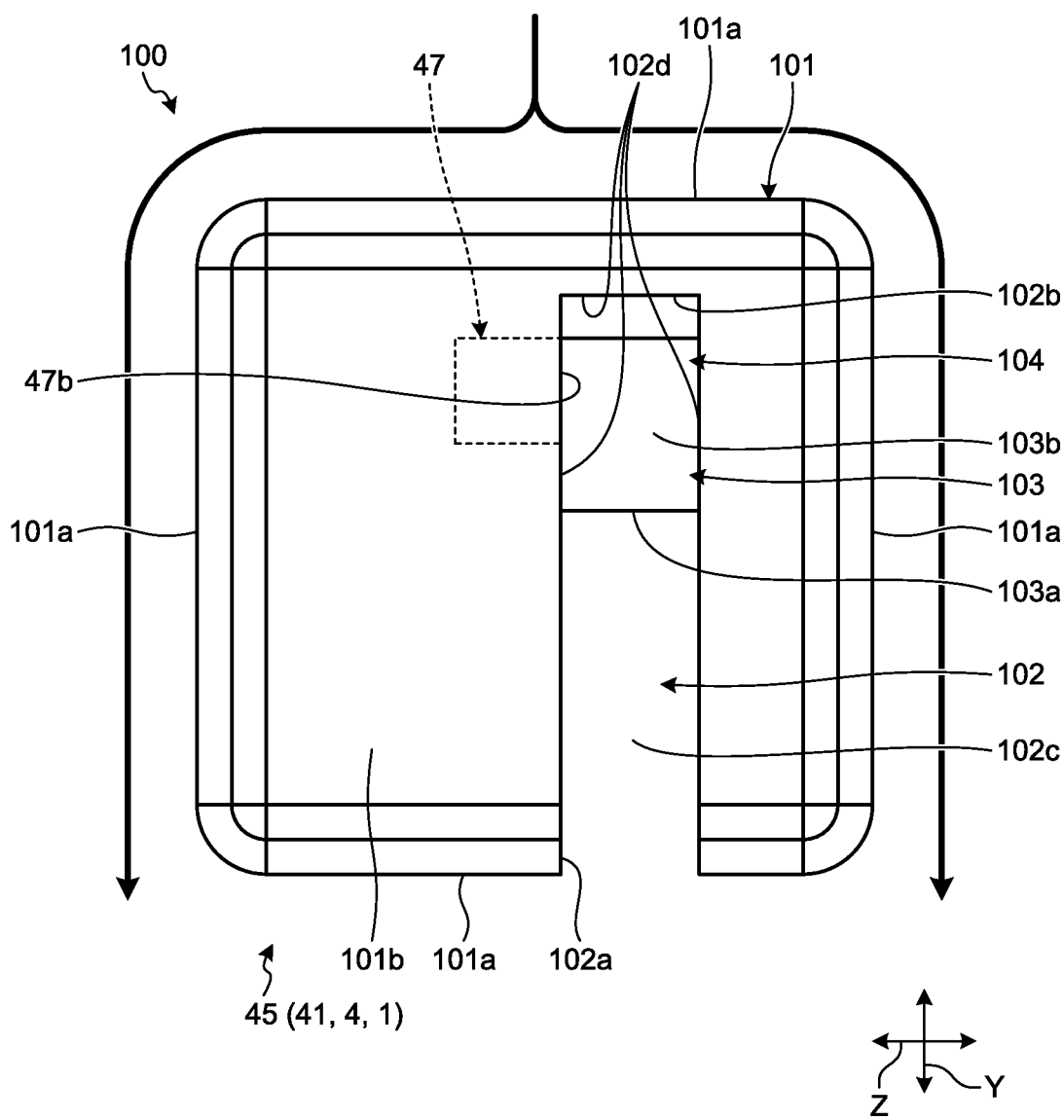
FIG. 9 is a front view for explaining a waterproofing action of the electronic component unit according to the embodiment.

For example, in FIG. 9, the electronic component unit 1 is installed on a vehicle at an installation position in which the first width direction Y is set in the vertical direction and the opening end 102a of the notch 102 is directed downward in the vertical direction. In this case, in the electronic component unit 1, as illustrated by arrows in FIG. 9, when liquid such as water flows from the upper side of the ventilator waterproofing structure 100 in the vertical direction, the liquid is received and made to flow by the side surfaces 101a of the projected columnar portion 101. As a result, in the electronic component unit 1, it is possible to prevent liquid from infiltrating into the outside opening 47b of the ventilation passage 47.

Figure 10:
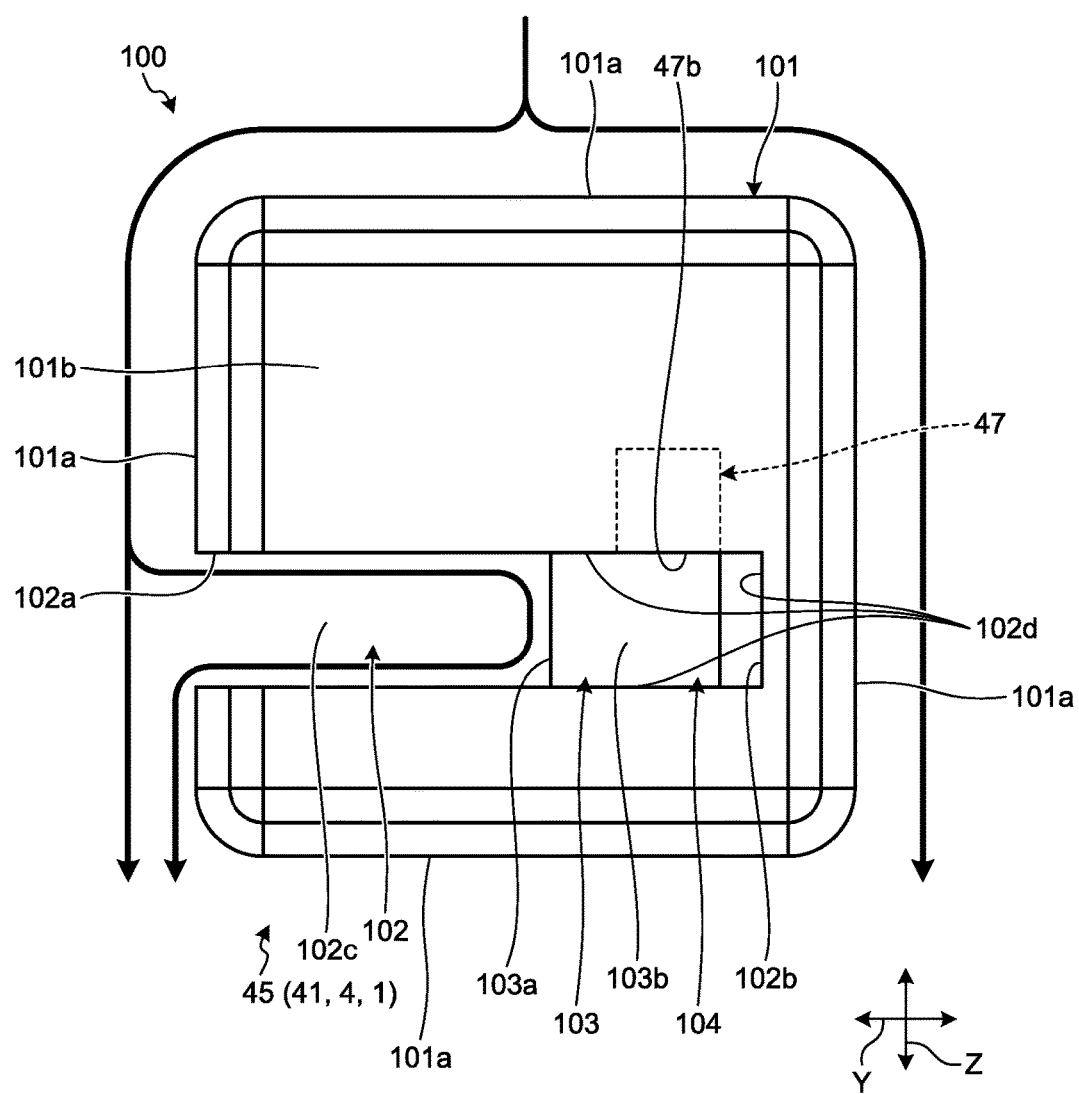
FIG. 10 is a front view for explaining the waterproofing action of the electronic component unit according to the embodiment.

Moreover, in FIG. 10, the electronic component unit 1 is installed on a vehicle at an installation position at which the second width direction Z is set in the vertical direction, the opening end 102a of the notch 102 is directed toward one of the sides in the horizontal direction, and the outside opening 47b is directed downward in the vertical direction. In this case, in the electronic component unit 1, as illustrated by the arrows in FIG. 10, when liquid such as water flows from the upper side of the ventilator waterproofing structure 100 in the vertical direction, the liquid is received and made to flow by the side surfaces 101a of the projected columnar portion 101. In this process, in the electronic component unit 1, even if a part of the received liquid is infiltrated into the notch 102 via the opening end 102a, the infiltrated liquid is blocked by the step 103a of the step portion 103, and most of the liquid is discharged from the notch 102. As a result, the electronic component unit 1 can prevent liquid from infiltrating into the outside opening 47b of the ventilation passage 47.

Figure 11:
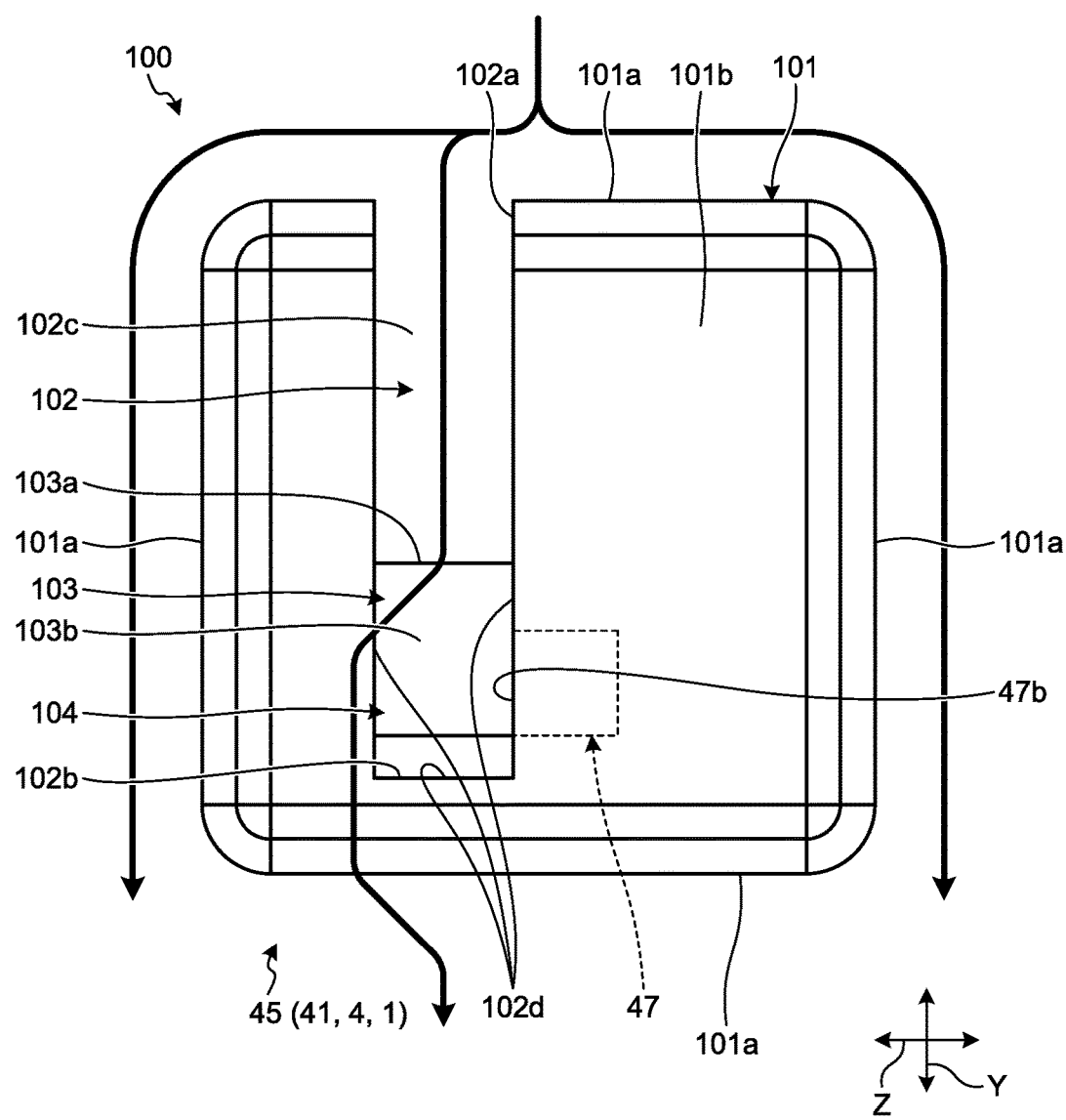
FIG. 11 is a front view for explaining the waterproofing action of the electronic component unit according to the embodiment.

Furthermore, in FIG. 11, the electronic component unit 1 is installed on a vehicle at an installation position where the first width direction Y is set in the vertical direction and the opening end 102a of the notch 102 is directed upward in the vertical direction. In this case, as illustrated by the arrows in FIG. 11, in the electronic component unit 1, when liquid such as water flows from the upper side of the ventilator waterproofing structure 100 in the vertical direction, the liquid is received and made to flow by the side surfaces 101a of the projected columnar portion 101. In this process, in the electronic component unit 1, even if a part of the liquid that has flowed from the upper side in the vertical direction is infiltrated into the notch 102 via the opening end 102a, the infiltrated liquid is blocked by the step 103a of the step portion 103, and most of the liquid is discharged from the notch 102 and falls down as it is. As a result, the electronic component unit 1 can prevent liquid from infiltrating into the outside opening 47b of the ventilation passage 47.

Figure 12:
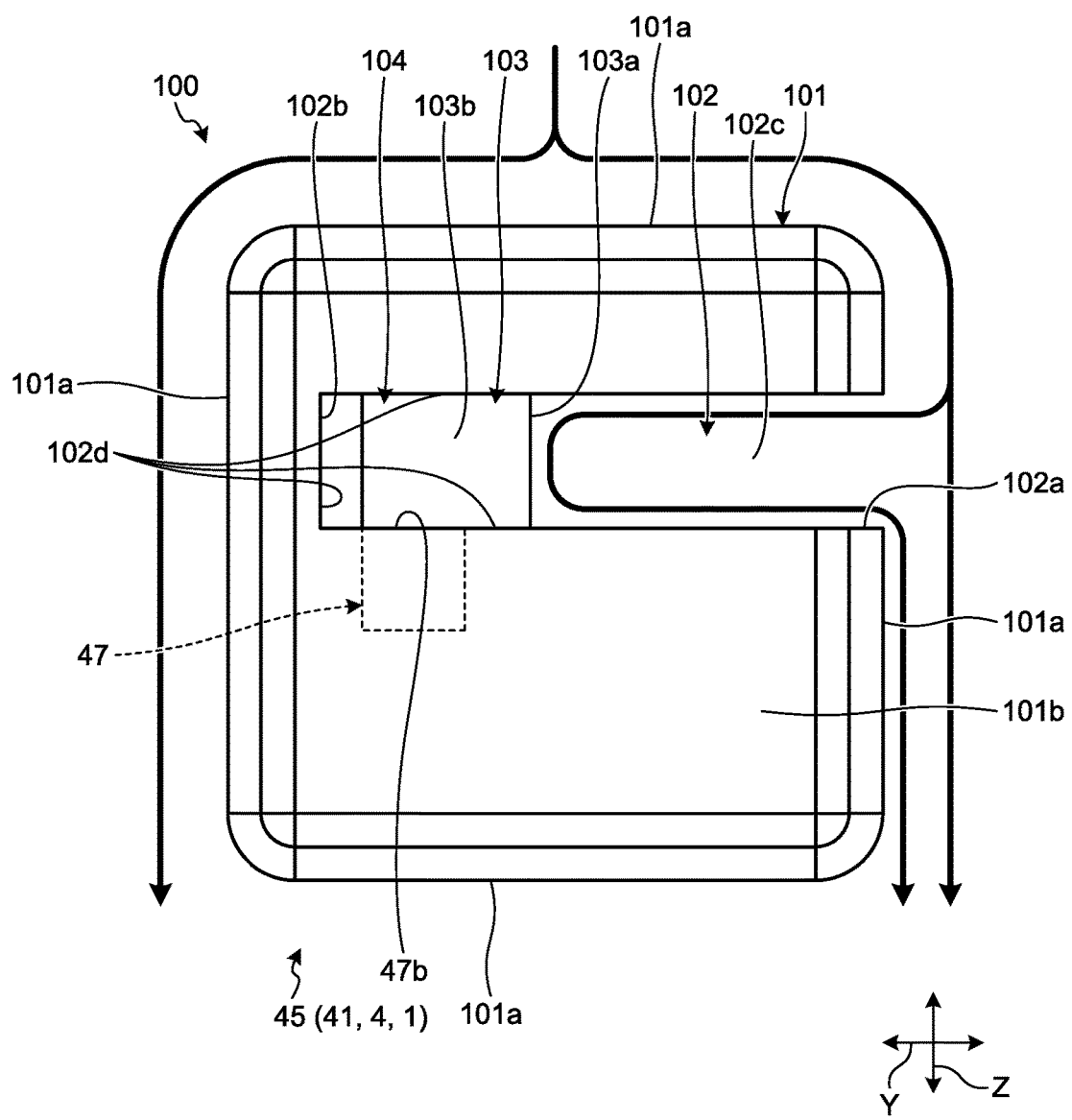
FIG. 12 is a front view for explaining the waterproofing action of the electronic component unit according to the embodiment.

Furthermore, in FIG. 12, the electronic component unit 1 is installed on a vehicle at an installation position where the second width direction Z is set in the vertical direction, the opening end 102a of the notch 102 is directed toward the other side in the horizontal direction, and the outside opening 47b is directed upward in the vertical direction. In this case, similar to that in FIG. 10, as illustrated by the arrows in FIG. 12, in the electronic component unit 1, when liquid such as water flows from the upper side of the ventilator waterproofing structure 100 in the vertical direction, the liquid is received and made to flow by the side surfaces 101a of the projected columnar portion 101. In this process, in the electronic component unit 1, even if a part of the received liquid is infiltrated into the notch 102 via the opening end 102a, the infiltrated liquid is blocked by the step 103a of the step portion 103, and most of the liquid is discharged from the notch 102. As a result, the electronic component unit 1 can prevent liquid from infiltrating into the outside opening 47b of the ventilation passage 47.

In the electronic component unit 1, the wire harness WH, and the ventilator waterproofing structure 100 described above, the ventilation passage 47 is provided in the casing main body 41 of the casing 4, and the waterproof ventilation filter 5 is provided in the ventilation passage 47 at the inside opening 47a side. With this configuration, in the electronic component unit 1, the internal pressure of the waterproof space 43 inside the casing 4 can be adjusted via the ventilation passage 47 and the waterproof ventilation filter 5. In the configuration of the electronic component unit 1 having the ventilation passage 47 and the waterproof ventilation filter 5, the ventilator waterproofing structure 100 is provided on the casing main body 41 of the casing 4, and the outside opening 47b of the ventilation passage 47 is opened to the closed space 104 of the ventilator waterproofing structure 100. With this configuration, in the electronic component unit 1, liquid such as water is prevented from infiltrating into the waterproof space 43 side in the casing 4 via the ventilation passage 47 and the waterproof ventilation filter 5. In other words, the electronic component unit 1 can adjust the internal pressure of the waterproof space 43 in the casing 4 and prevent liquid from infiltrating into the waterproof space 43 side. In this case, in the electronic component unit 1, the closed space 104 toward which the outside opening 47b is opened is configured as the space surrounded by the inner wall surfaces 102d of the notch 102 and the step surface 103b of the step portion 103, on the closed end 102b side of the notch 102 provided on the projected columnar portion 101. With this configuration, the electronic component unit 1 can reliably prevent liquid from infiltrating into the waterproof space 43 side via the outside opening 47b at various installation positions. Moreover, liquid is prevented from accumulating at the vicinity of the ventilation passage 47. As a result, the electronic component unit 1, the wire harness WH, and the ventilator waterproofing structure 100 can suitably prevent liquid from infiltrating into the waterproof space 43 side in the casing 4. Moreover, for example, because it is possible to prevent liquid and the like from accumulating in the waterproof ventilation filter 5 side in the ventilation passage 47, the electronic component unit 1 can prevent the waterproof ventilation filter 5 from being clogged, ensure proper breathability, and properly adjust the internal pressure.

In the electronic component unit 1, the wire harness WH, and the ventilator waterproofing structure 100 described above, the outside opening 47b is disposed on the step 103a of the step portion 103 at the interval D in the first width direction Y. With this configuration, the electronic component unit 1, the wire harness WH, and the ventilator waterproofing structure 100 can more reliably prevent liquid from infiltrating into the waterproof space 43 side via the outside opening 47b.

Moreover, in the electronic component unit 1, the wire harness WH, and the ventilator waterproofing structure 100 described above, the connector fitting portion 46 is integrally formed on the casing 4. Consequently, as described above, the electronic component unit 1, the wire harness WH, and the ventilator waterproofing structure 100 can properly prevent liquid from infiltrating into the waterproof space 43 side in the casing 4.

The electronic component unit, the wire harness, and the ventilator waterproofing structure according to the embodiment described above are not limited to those in the above embodiment, and various modifications may be made within the scope of the appended claims.

The casing main body 41 of the casing 4 described above includes the connector fitting portion 46. However, it is not limited thereto.

The sectional shape of the ventilation passage 47 described above in the direction orthogonal to the laminating direction X is formed in a substantially rectangular shape. However, the shape is not limited thereto, and for example, the sectional shape may be formed in a substantially circular shape.

The projected columnar portion 101 described above is formed in a substantially rectangular parallelepiped shape. However, it is not limited thereto.

In the electronic component unit, the wire harness, and the ventilator waterproofing structure according to the present embodiment, the ventilation passage is provided in the casing, and the waterproof ventilation filter is provided on the ventilation passage at the inside opening side. With this configuration, the electronic component unit can adjust the internal pressure of the waterproof space in the casing via the ventilation passage and the waterproof ventilation filter. In the configuration of the electronic component unit having the ventilation passage and the waterproof ventilation filter, the ventilator waterproofing structure is provided in the casing, and the outside opening of the ventilation passage is opened to the closed space in the ventilator waterproofing structure. With this configuration, the electronic component unit can prevent liquid such as water from infiltrating into the waterproof space side in the casing via the ventilation passage and the waterproof ventilation filter. In this case, in the electronic component unit, the closed space toward which the outside opening is opened is formed as the space surrounded by the inner wall surfaces of the notch and the step surface of the step portion, on the closed end side of the notch provided in the projected columnar portion.

As a result, the electronic component unit exhibits advantageous effects of being able to properly prevent liquid from infiltrating into the waterproof space side in the casing.

Although the invention has been described with respect to the specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electronic component unit, comprising:
    a casing that includes a wall body forming a waterproof space that accommodates an electronic component and a ventilation passage penetrating through the wall body in a first direction and communicating an inside and an outside of the waterproof space; and
    a waterproof ventilation filter that is provided by covering an inside opening as an opening of the ventilation passage on the waterproof space side, and that prevents liquid from passing therethrough but allows gas to pass therethrough, wherein
    the casing includes:
        a ventilator waterproofing structure including
            a projected columnar portion that is formed in a columnar shape and that is projected toward the outside of the waterproof space from the wall body in the first direction,
            a notch that is formed on the projected columnar portion in a straight line in a second direction intersecting with the first direction, that forms an opened end that is an end on one side in the second direction opened on a side surface of the projected columnar portion in the second direction, and that forms a closed end that is a closed end on another side in the second direction,
            a step portion that is formed to have a step provided in the notch on the closed end side and that is projected toward the outside of the waterproof space from a bottom surface of the notch in the first direction relative to the bottom surface in the first direction, and
            a closed space surrounded by an inner wall surface of the notch and a step surface of the step portion relative to the bottom surface, and
        the ventilation passage includes an outside opening that extends to an inside of the projected columnar portion in the first direction and that is opened toward the closed space in a third direction intersecting with the first direction and the second direction in the notch.

2. The electronic component unit according to claim 1, wherein
    the outside opening is disposed on the step of the step portion at an interval in the second direction.

3. The electronic component unit according to claim 1, wherein
    the casing includes a connector fitting portion that is integrally formed with the wall body and into which a counterpart connector electrically connected with the electronic component is capable of being fitted.

4. The electronic component unit according to claim 2, wherein
    the casing includes a connector fitting portion that is integrally formed with the wall body and into which a counterpart connector electrically connected with the electronic component is capable of being fitted.

5. A wire harness, comprising:
    a conductive wiring member; and
    an electronic component unit electrically connected to the wiring member, wherein
    the electronic component unit includes:
        a casing that includes a wall body forming a waterproof space that accommodates an electronic component to be electrically connected to the wiring member and a ventilation passage penetrating through the wall body in a first direction and communicating an inside and an outside of the waterproof space, and
        a waterproof ventilation filter that is provided by covering an inside opening as an opening of the ventilation passage on the waterproof space side, and that prevents liquid from passing therethrough but allows gas to pass therethrough,
    the casing includes a ventilator waterproofing structure including:

a projected columnar portion that is formed in a columnar shape and that is projected toward the outside of the waterproof space from the wall body in the first direction;

a notch that is formed on the projected columnar portion in a straight line in a second direction intersecting with the first direction, that forms an opened end that is an end on one side in the second direction opened on a side surface of the projected columnar portion in the second direction, and that forms a closed end that is a closed end on another side in the second direction;

a step portion that is formed to have a step provided in the notch on the closed end side and that is projected toward the outside of the waterproof space from a bottom surface of the notch in the first direction relative to the bottom surface in the first direction; and a closed space surrounded by an inner wall surface of the notch and a step surface of the step portion relative to the bottom surface, and the ventilation passage includes an outside opening that extends to an inside of the projected columnar portion in the first direction and that is opened toward the closed space in a third direction intersecting with the first direction and the second direction in the notch.

6. A ventilator waterproofing structure, comprising:

a projected columnar portion that is formed in a columnar shape and that is projected toward an outside of a waterproof space from a wall body of a casing forming the waterproof space, in a first direction;

a notch that is formed on the projected columnar portion in a straight line in a second direction intersecting with the first direction, that forms an opened end that is an end on one side in the second direction opened on a side surface of the projected columnar portion in the second direction, and that forms a closed end that is a closed end on another side in the second direction;

a step portion that is formed to have a step provided in the notch on the closed end side and that is projected toward the outside of the waterproof space from a bottom surface of the notch in the first direction relative to the bottom surface in the first direction; and a closed space surrounded by an inner wall surface of the notch and a step surface of the step portion relative to the bottom surface, wherein a ventilation passage, that penetrates through the wall body in the first direction and communicates an inside and the outside of the waterproof space, and that is provided with a waterproof ventilation filter that covers an inside opening as an opening on the waterproof space side and preventing liquid from passing therethrough but allowing gas to pass therethrough, includes an outside opening that extends to an inside of the projected columnar portion in the first direction and that is opened toward the closed space in a third direction intersecting with the first direction and the second direction in the notch.

* * * * *